(12) United States Patent
Tsuji (10) Patent No.: US 8,389,395 B2
(45) Date of Patent: Mar. 5, 2013

(54) METHOD FOR MANUFACTURING SEMICONDUCTOR OPTICAL DEVICE

(75) Inventor: Yukihiro Tsuji, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/224,546

(22) Filed: Sep. 2, 2011

(65) Prior Publication Data
US 2012/0058635 A1    Mar. 8, 2012

(30) Foreign Application Priority Data
Sep. 7, 2010   (JP) .................................. 2010-200266

(51) Int. Cl.
*H01L 21/44* (2006.01)

(52) U.S. Cl. .......... 438/612; 438/22; 438/474; 438/475; 438/788; 438/798; 257/E21.158; 257/E29.111; 257/E33.062

(58) Field of Classification Search ............... 438/22, 438/125, 612; 257/99, E21.158, E33.062
See application file for complete search history.

(56) References Cited

U.S. PATENT DOCUMENTS

| 2002/0060316 A1 | 5/2002 | Matsuyama |
| 2007/0187707 A1* | 8/2007 | Tsuji et al. ...................... 257/99 |
| 2008/0062112 A1* | 3/2008 | Umezaki ...................... 345/100 |

FOREIGN PATENT DOCUMENTS

JP    2002-164622    6/2002

* cited by examiner

*Primary Examiner* — Charles Garber
*Assistant Examiner* — Abdulfattah Mustapha
(74) *Attorney, Agent, or Firm* — Smith, Gambrell & Russell, LLP (57) ABSTRACT

A method for manufacturing includes the steps of forming a BCB resin region on a semiconductor optical device; processing a surface of the BCB resin region with inductively coupled plasma produced with a high-frequency power supply for supplying ICP power and a high-frequency power supply for supplying bias power, thus forming a silicon oxide film on the surface of the BCB resin region and roughening the surface of the BCB resin region with projections and recesses; and forming an electrode pad on the surface of the BCB resin region in direct contact with the silicon oxide film. The surface roughness of the BCB resin region and the thickness of the silicon oxide film on the surface of the BCB resin region are controlled by adjusting the bias power and the ICP power.

9 Claims, 11 Drawing Sheets

METHOD FOR MANUFACTURING SEMICONDUCTOR OPTICAL DEVICE

BACKGROUND OF THE INVENTION

1. Field of the Invention

The present invention relates to a method for manufacturing a semiconductor optical device.

2. Description of the Related Art

Japanese Unexamined Patent Application Publication No. 2002-164622 discloses a technique concerning semiconductor optical devices. The semiconductor optical devices include a light-emitting device, a light-receiving device, and an optical modulator. The semiconductor devices each have a mesa portion provided with an active layer having a light-emitting, light-receiving, or light modulating function. Further, the mesa portion is surrounded by a BCB (benzocyclobutene) resin. In addition, an electrode pad (bonding pad) made of a metal is provided on the BCB resin in order to make electric connection with the semiconductor optical device.

When an electrode pad is provided on the semiconductor optical device including a light-generating, -absorbing, or -guiding layer, a BCB resin region is interposed between the semiconductor optical device and the electrode pad in order to decrease a parasitic capacitance. When a bonding wire is mounted on the electrode pad, a tensile force is applied to the electrode pad. Therefore, the electrode pad and the BCB resin are desired to have bonding strength therebetween sufficient to resist the tensile force. However, the electrode pad is generally composed of a metal, and thus a combination of a metal and resin is difficult to provide enough bonding strength. In particular, a BCB surface contains a large amount of carbon component and is not easily strongly bonded to a metal. The insufficient bonding strength may cause separation of the electrode pad from the BCB resin when a bonding wire is mounted on the electrode pad.

SUMMARY OF THE INVENTION

A method for manufacturing a semiconductor optical device according to the present invention includes the steps of forming a BCB resin region on a semiconductor optical device; processing a surface of the BCB resin region with inductively coupled plasma produced from gas containing oxygen atoms in an inductively coupled plasma apparatus, which is provided with a high-frequency power supply for supplying ICP power and a high-frequency power supply for supplying bias power, thus forming a silicon oxide film on the surface of the BCB resin region and roughening the surface of the BCB resin region with projections and recesses; and forming an electrode pad composed of a metal on the surface of the BCB resin region in direct contact with the silicon oxide film. Further, in the step of processing a surface of the BCB resin region, surface roughness of the BCB resin region and the thickness of the silicon oxide film on the surface of the BCB resin region are controlled by adjusting the bias power and the ICP power.

In the method for manufacturing a semiconductor optical device, the surface of the BCB resin region is processed with inductively coupled plasma (ICP) to roughen the surface of the BCB resin region with projections and recesses, thereby increasing the surface area. In addition, the silicon oxide film having relatively high bonding strength with a metal is formed on the surface of the BCB resin region using the plasma produced from the gas containing oxygen atoms. Further, the ICP plasma is produced in the inductively coupled plasma apparatus provided with the high-frequency power supply for supplying ICP power and the high-frequency power supply for supplying bias power. By independently adjusting the bias power and the ICP power, a surface roughness of the BCB resin region and a thickness of the silicon oxide film on the surface of the BCB resin region can be controlled to predetermined values. For example, preferred surface roughness can be realized by adjusting the bias power to a proper range, while the silicon oxide film is formed to a sufficient thickness by increasing the ICP powder. Therefore, the method for manufacturing a semiconductor optical device is capable of increasing the bonding strength between the electrode pad and the BCB resin.

Also, in the method for manufacturing a semiconductor optical device, in the step of processing the surface of the BCB resin region, the bias power can be controlled to 50 W or more and 100 W or less. Further, the ICP power can be controlled to 50 W or more and 100 W or less.

In addition, in the method for manufacturing a semiconductor optical device, in the step of processing the surface of the BCB resin region, the surface roughness of the BCB resin region may be controlled to 3 nm or more and 5 nm or less.

Further, in the method for manufacturing a semiconductor optical device, in the step of processing the surface of the BCB resin region, the thickness of the silicon oxide film may be controlled to 4 nm or more and 50 nm or less.

In addition, in the method for manufacturing a semiconductor optical device, the electrode pad may be composed of a metal containing titanium. Also, the electrode pad may have a three-layer structure of titanium/platinum/gold and can be formed so that titanium is in direct contact with the silicon oxide film formed on the surface of the BCB resin region. When the electrode pad is formed so that titanium constituting the electrode pad directly contacts the silicon oxide film formed on the surface of the BCB resin region, the bonding strength between the electrode pad and the BCB resin region can be increased.

In addition, the method for manufacturing a semiconductor optical device further includes the step of forming an insulating layer on the semiconductor optical device.

In addition, the method for manufacturing a semiconductor optical device further includes the step of forming an opening in the insulating layer. Further, the electrode pad may be formed on the silicon oxide film formed on the surface of the BCB resin region, on the insulating layer, and in the opening to electrically connect the electrode pad to the semiconductor optical device.

DESCRIPTION OF THE PREFERRED EMBODIMENTS

A method for manufacturing a semiconductor optical device according to an embodiment of the present invention is described in detail below with reference to the accompanying drawings. In description of the drawings, the same component is denoted by the same reference numeral, and repeated description is omitted.

First Embodiment

Figure 1:
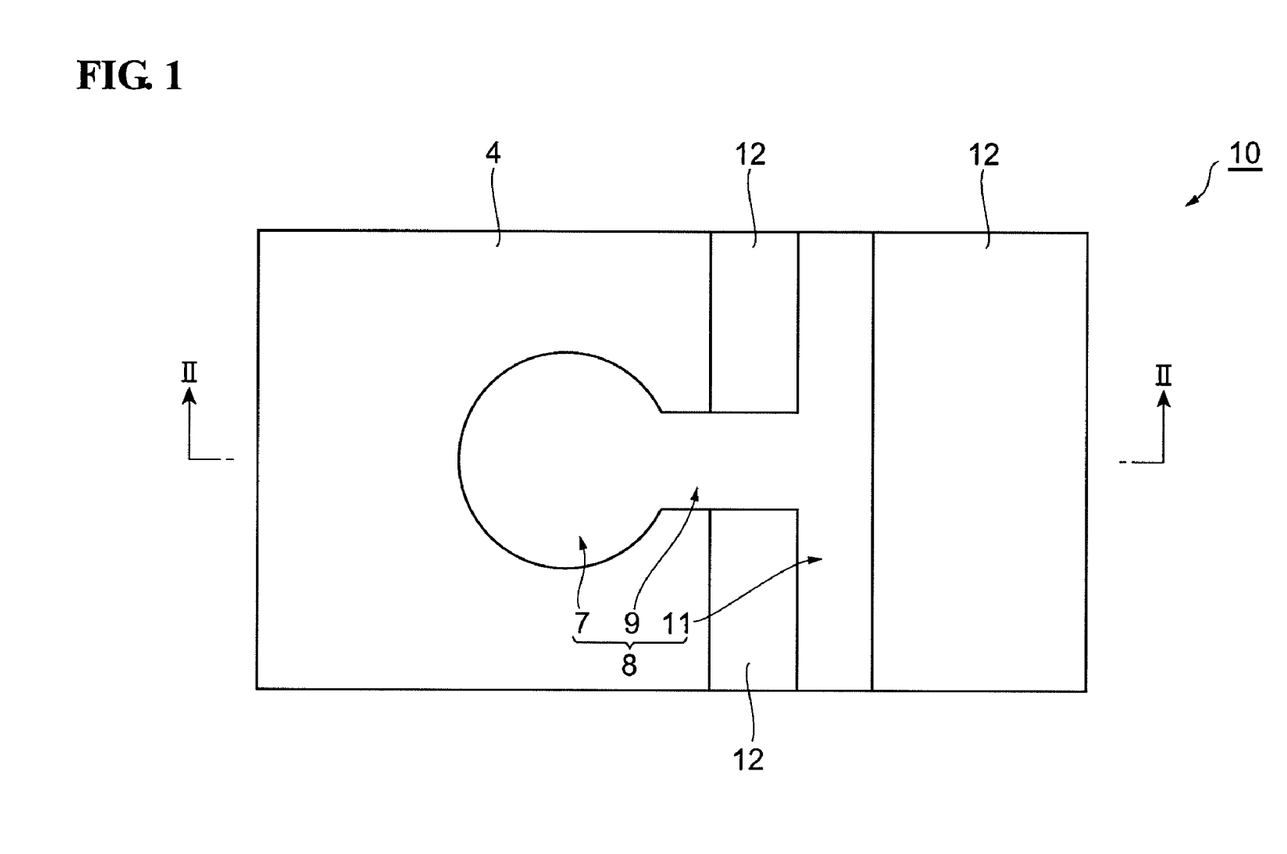
FIG. 1 is a plan view schematically showing a semiconductor optical device according to a first embodiment.
Figure 2:
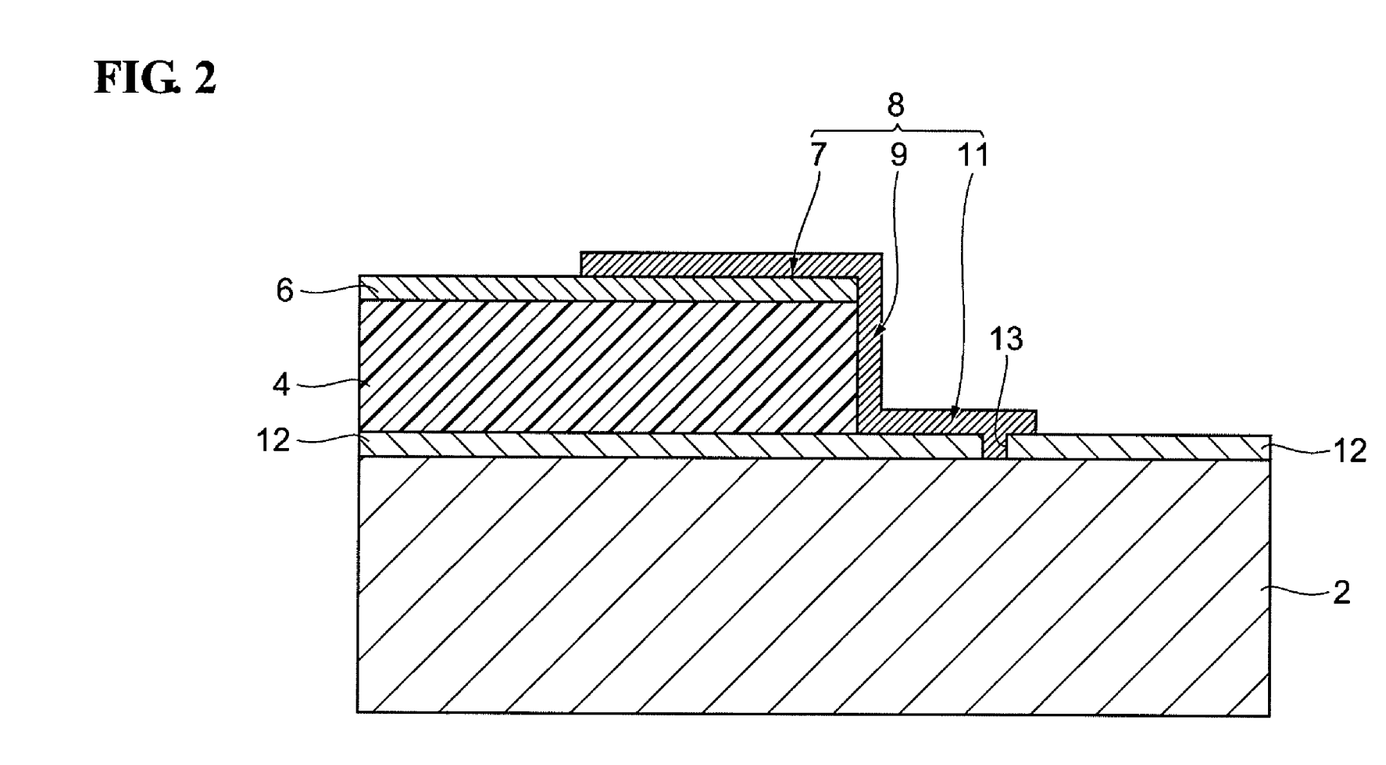
FIG. 2 is a sectional view taken along line II-II in FIG. 1.

FIG. 1 is a plan view schematically showing a semiconductor optical device 10 according to a first embodiment. FIG. 2 is a sectional view taken along line II-II in FIG. 1. A semiconductor optical device 10 shown in FIGS. 1 and 2 includes a semiconductor optical device 2, a BCB resin region 4 provided on the semiconductor optical device 2, a silicon oxide film 6 provided on the BCB resin region 4, and an electrode pad 8 provided on the silicon oxide film 6. The BCB resin region 4, the silicon oxide film 6, and the electrode pad 8 are provided to adhere to each other.

An insulating layer (passivation film) 12 is preferably provided between the semiconductor optical device 2 and the BCB resin region 4. The insulating layer 12 is composed of, for example, a silicon oxide such as $SiO_2$. In addition, an opening 13 is formed in the insulating layer 12, and the electrode pad 8 is buried in the opening 13. Furthermore, the electrode pad 8 is in direct contact with a top surface of the semiconductor optical device 2. The opening 13 is, for example, a groove extending in a predetermined direction.

As the semiconductor optical device 2, for example, a semiconductor laser, a photodiode, or an optical modulator can be used. When the semiconductor optical device 2 is a semiconductor laser, the semiconductor optical device 2 includes an active layer in which a light is generated. When the semiconductor optical device 2 is a photodiode, the semiconductor optical device 2 includes a light-absorbing layer in which a signal light is absorbed. When the semiconductor optical device 2 is an optical modulator, the semiconductor optical device 2 includes an optical waveguide layer in which a light is modulated.

The BCB resin region 4 is composed of benzocyclobutene (BCB) resin. The BCB resin has good characteristics such as a low dielectric constant and high thermal resistance. Therefore, the electrostatic capacitance (parasitic capacitance) of the semiconductor optical device 10 can be decreased by the BCB resin region 4. As a result, the semiconductor optical device 10 has high-speed operation characteristics. As the BCB resin, for example, divinyltetramethyl siloxane-bisbenzocyclobutene (DVS-bisBCB) combined with 20 to 30 atomic % of Si atoms is preferred. Also, a Si-containing carbosilane compound or siloxane compound may be used as the BCB resin. The thickness of the BCB resin region 4 is, for example, 2 μm or more and 6 μm or less.

The silicon oxide film 6 is formed by oxidation of Si in the BCB resin. The preferred thickness of the silicon oxide film 6 is 4 nm or more and 50 nm or less. When the thickness of the silicon oxide film 6 is 4 nm or more, the carbon component remaining in the silicon oxide film 6 can be effectively decreased, and thus sufficient adhesion between the BCB resin region 4 and the electrode pad 8 can be achieved. In addition, when the thickness of the silicon oxide film 6 is 50 nm or less, cracking of the silicon oxide film 6 due to voids in the silicon oxide film 6 and, consequently, cracking of the BCB resin region 4 can be effectively decreased. The thickness of the silicon oxide film 6 is measured by, for example, using XPS (X-ray photoelectron spectroscopy analyzer).

The electrode pad 8 includes a pad portion 7, an electrode portion 11, and a connection portion 9. The connection portion 9 connects the pad portion 7 and the electrode portion 11. The pad portion 7 includes a sheet-shaped member provided on the silicon oxide film 6. The pad portion 7 functions as a bonding pad for mounting a bonding wire thereon. In an embodiment, the pad portion 7 has a disk shape having a diameter of 60 μm and a thickness of 3 μm. The electrode portion 11 is buried in the opening 13 of the insulating layer 12 and is electrically connected to the semiconductor optical device 2. The electrode pad 8 is preferably composed of titanium (Ti). More preferably, the electrode pad 8 has a titanium (Ti)/platinum (Pt)/gold (Au) three-layer structure. In this case, titanium (Ti) is brought in direct contact with the silicon oxide film formed on the surface of the BCB resin region 4. Besides these materials for the electrode pad 8, AuGe, Ni, AuZn, and the like can be used. The thickness of the electrode pad 8 is preferably 2.5 μm or more and 3.5 μm or less.

In the semiconductor optical device 10 of the embodiment, the BCB resin region 4 is connected to the electrode pad 8 through the silicon oxide film 6, thereby improving adhesion between the BCB resin region 4 and the electrode pad 8. In particular, when the thickness of the silicon oxide film 6 is 4 to 50 nm, the adhesion between the BCB resin region 4 and the electrode pad 8 can be improved. In addition, the adhesion between the BCB resin region 4 and the electrode pad 8 can be further improved by adjusting the surface roughness and elastic modulus of the silicon oxide film 6.

When the electrode pad 8 is composed of titanium (Ti), the adhesion between the BCB resin region 4 and the electrode pad 8 can be further improved as compared with the electrode pad 8 composed of, for example, gold (Au) or platinum (Pt). Further, the electrostatic capacitance between the electrode pad 8 and the semiconductor device 2 can be decreased by providing the BCB resin region 4, thereby permitting high-speed operation of the semiconductor optical device 2.

Here, the method for manufacturing the semiconductor optical device 10 having the above-described configuration is described.

(Resin Layer Forming Step)

Figure 3A:
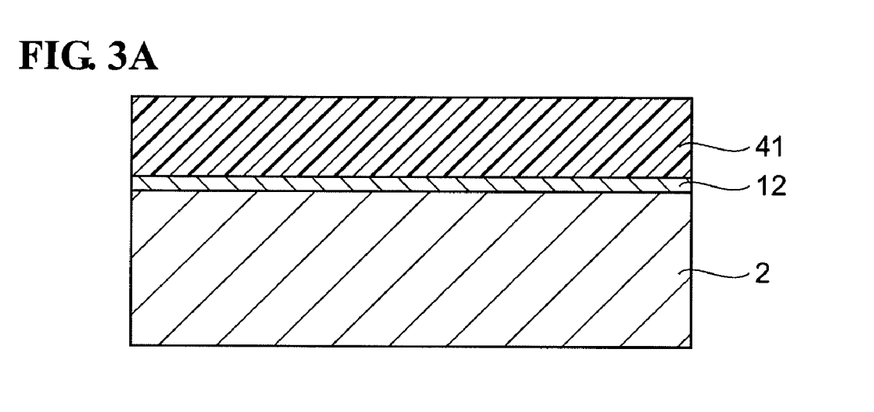
FIGS. 3A to 3C are drawings showing a resin layer forming step and a plasma processing step.
Figure 3B:
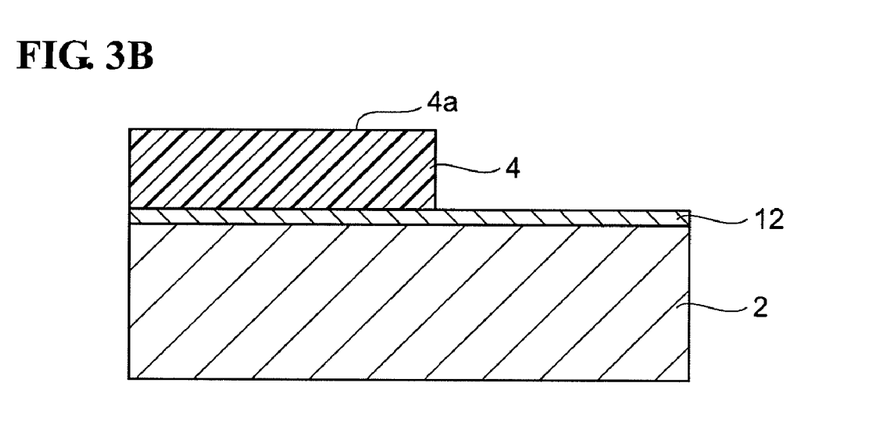

First, as shown in FIG. 3A, a BCB resin is applied to the semiconductor optical device 2 to form a BCB resin layer 41. The BCB resin layer 41 is preferably formed after the insulating layer 12 is formed on the semiconductor optical device 2. Then, the BCB resin layer 41 is thermally cured. Then, as shown in FIG. 3B, the BCB resin layer 41 is partially etched to form the BCB resin region 4 shown in FIGS. 1 and 2.

According to an embodiment, surface roughness Ra of the surface 4a of the BCB resin region 4 is 2.37 Å. In the present invention, the surface roughness Ra is calculated from an image formed by, for example, an atomic force microscope (AFM). According to an embodiment, a surface layer portion (thickness of 4 to 5 nm) of the BCB resin region 4 has a carbon atom content of about 88 atomic %, an oxygen atom content of about 5.1 atomic %, and a silicon atom content of about 7.2 atomic %. In the specification, the atom contents are measured by, for example, X-ray photoelectron spectroscopy (XPS).

(Plasma Processing Step)

Figure 3C:
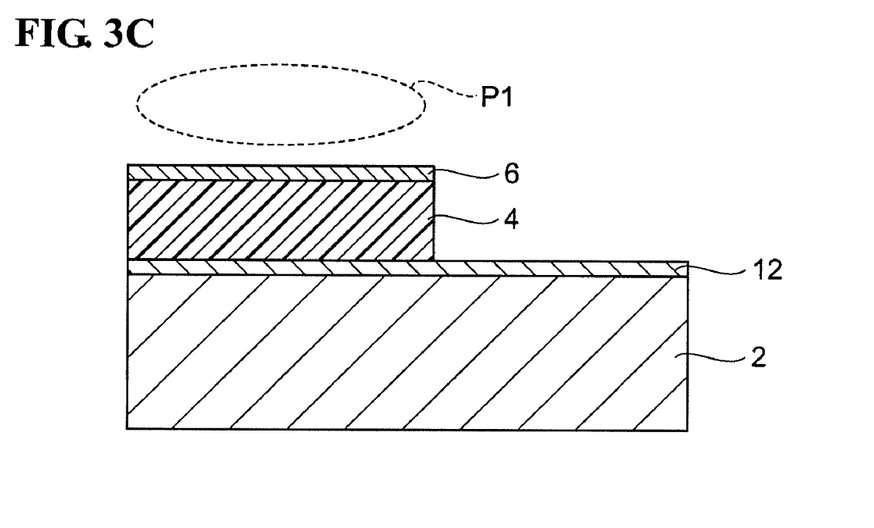

Then, as shown in FIG. 3C, the surface 4a of the BCB resin region 4 is processed with plasma P1 produced from mixed gas of gas containing oxygen atoms and inert gas. This processing forms projections and recesses on the surface 4a of the BCB resin region 4 and forms the silicon oxide film 6 on the surface 4a of the BCB resin region 4.

As the gas containing oxygen atoms, oxygen gas ($O_2$) is preferably used. In addition, nitrogen gas ($N_2$) is preferably used as the inert gas. As the inert gas, rare gas such as helium, neon, or argon may be used.

In the plasma processing step, since oxygen atoms are present in the plasma P1, carbon atoms in the BCB region are bonded with oxygen atoms and removed as carbon dioxide ($CO_2$) from the surface 4a of the BCB resin region 4. In addition, Si in the BCB resin is bonded with oxygen to form $SiO_2$, which deposits on the surface 4a of the BCB resin region 4. As a result, the silicon oxide film 6 having a desired thickness (for example, 4 nm or more and 50 nm or less) is formed on the surface 4a of the BCB resin region 4. In addition, the surface 4a of the BCB resin region 4 is simultaneously roughened with nitrogen atoms in the plasma P1, thereby increasing the surface roughness of the surface 4a.

Figure 4:
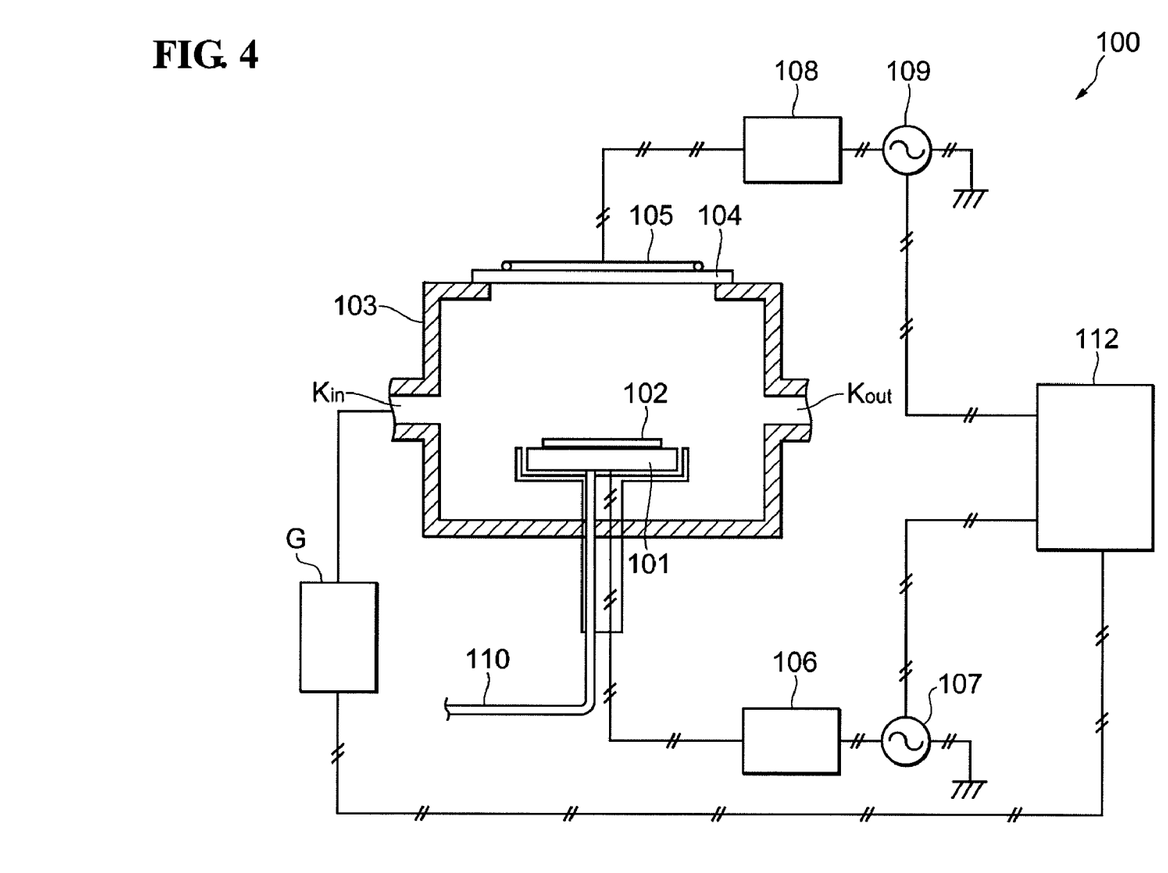
FIG. 4 is a configuration drawing schematically showing a plasma generating apparatus.

In the embodiment, the plasma P1 is generated by an Inductively Coupled Plasma (ICP) equipment. FIG. 4 is a configuration diagram (including a sectional view of a portion) schematically showing a plasma apparatus used in the embodiment. A plasma apparatus 100 shown in FIG. 4 includes a vacuum chamber 103 provided for generating inductively coupled plasma (ICP) therein. In addition, a susceptor 101 is provided in the vacuum chamber 103 so that a wafer 102 is placed thereon. The vacuum chamber 103 also includes a gas inlet $K_{in}$, a gas outlet $K_{out}$, and a high-frequency introduction window 104.

The gas inlet $K_{in}$ is an opening for introducing the gas into the vacuum chamber 103. In the embodiment, a gas containing an oxygen atom and a nitrogen ($N_2$) gas are introduced into the vacuum chamber 103 through the gas inlet $K_{in}$. A gas feed system G (gas supply portion) including a supply source of each of the gases and a mass flow controller (MFC) connected to the supply source is connected to the gas inlet $K_{in}$. The gas outlet $K_{out}$ is an opening for exhausting the gas from the vacuum chamber 103. An exhaust system (not shown) including a vacuum pump and an exhaust control valve that controls an exhaust conductance is connected to the gas outlet $K_{out}$.

Further, the susceptor 101 includes a built-in heater (not shown). A coolant circulating pipe 110 is connected to the susceptor 101. Therefore, the susceptor 101 is heated to a predetermined desired temperature and kept at the temperature or cooled to a predetermined desired temperature and kept at the temperature. In addition, a high-frequency power supply 107 (bias output power supply) is connected to the susceptor 101 through an impedance matching box (matching network) 106 in order to apply bias high-frequency power to the susceptor 101. A high-frequency electromagnetic field generated by an induction coil 105 (high-frequency induction coil) which is installed outside the vacuum chamber 103 is introduced into the vacuum chamber 103 through the high-frequency introduction window 14 provided in an upper portion of the vacuum chamber 103. In addition, a high-frequency power supply 109 (ICP output power supply) is connected to the induction coil 105 through an impedance matching box 108 in order to apply high-frequency power to the induction coil 105. The high-frequency power supplies 107 and 109 are grounded at the same predetermined potential.

Further, a control system 112 (control portion) is connected to the MFC of the gas feed system G and the high-frequency power supplies 107 and 109. The control system 112 is adapted for independently controlling the valve opening of a flow regulating valve of each MFC and the outputs of the high-frequency power supplies 107 and 109. Therefore, each of the operation conditions is previously input or stored or appropriately input by an input unit (not shown).

When the wafer 102 placed on the susceptor 101 is processed in the plasma, a self-bias voltage (minus voltage on the susceptor 101 side) is applied to the susceptor 101, and at the same time, a process gas is supplied to the vacuum chamber 103 with the ICP voltage applied to the induction coil 105. In the embodiment, a nitrogen ($N_2$) gas and an oxygen ($O_2$) gas are used as the process gas. The process gas is put into a plasma state by applying the ICP power to the vacuum chamber 103. In addition, a bias high-frequency power is applied to the susceptor 101 from the high-frequency power supply 107 to generate the self-bias voltage. Ions in the thus-produced plasma gas are accelerated by a DC bias electric field produced by the self-bias voltage in the vacuum chamber 103 and collide with the surface of the wafer 102. Further, active radicals in the plasma gas are diffused and reach the surface of the wafer 102.

These ions and radicals form projections and recesses on the surface of the wafer (processing object) 102.

In order to produce the plasma P1 using the plasma generating apparatus 100, the process pressure is preferably 1 Pa or more and 10 Pa or less. When the process pressure is 1 Pa or more, stable discharge can be achieved. In addition, when the process pressure is 10 Pa or less, damage to the surface 4a of the BCB resin region 4 due to collision with ions can be decreased. The process pressure is most preferably 4 Pa.

Further, the high-frequency electric power (ICP power) supplied to the induction coil 105 from the ICP output power supply 109 is preferably 50 W or more and 100 W or less. With an ICP power of 100 W or less, the surface 4a of the BCB resin region 4 can be prevented from being excessively etched to come close to flatness. The bias high-frequency power (bias power) supplied to the susceptor 101 from the bias output power supply 107 is preferably 50 W or more and 100 W or less. With a bias power of 50 W or more, plasma discharge can be stabilized and surface roughness of the surface 4a of the BCB resin region 4 can be sufficiently increased. In addition, with a bias power of 100 W or less, the BCB resin region can be prevented from being embrittled and cracked due to excessive increase in surface roughness of the surface 4a.

(Electrode Pad Forming Step)

Then, as shown in FIGS. 1, 2, and 5A to 5C, the electrode pad 8 is formed on the silicon oxide film 6. The electrode pad 8 is formed by, for example, a liftoff method as described below.

Figure 5A:
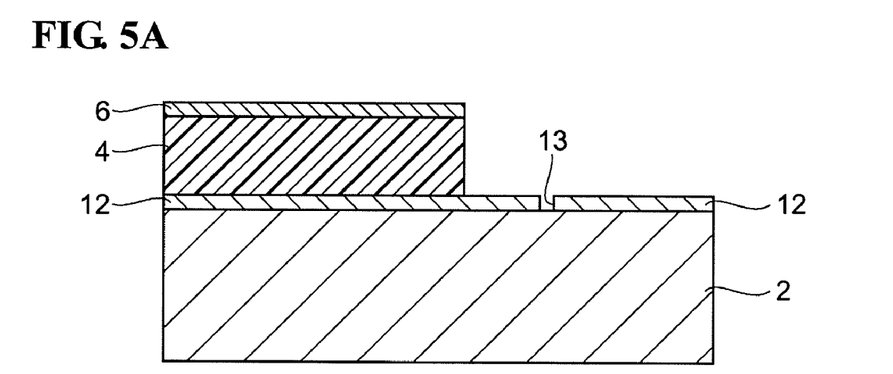
FIGS. 5A to 5C are drawings showing an electrode pad forming step.
Figure 5B:
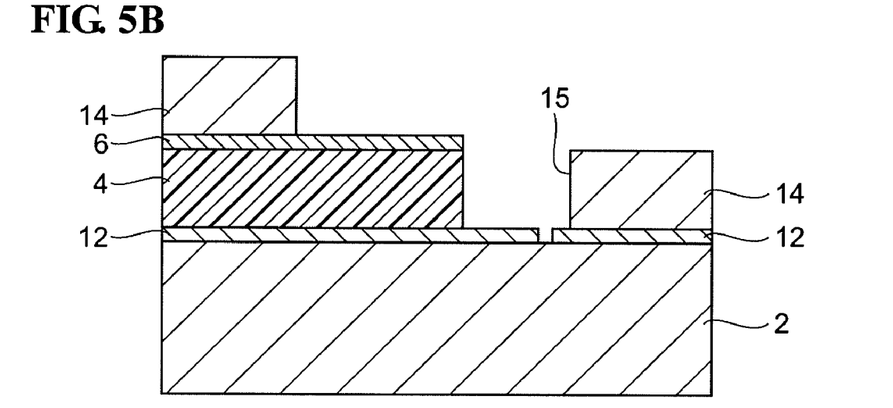

First, as shown in FIG. 5A, the insulating layer 12 is etched by, for example, a photolithography method to form the opening 13. Next, as shown in FIG. 5B, a resist 14 having an opening 15 formed by, for example, a photolithography method is formed on the silicon oxide film 6 and the insulating layer 12. The opening 15 is preferably formed to expose the opening 13.

Figure 5C:
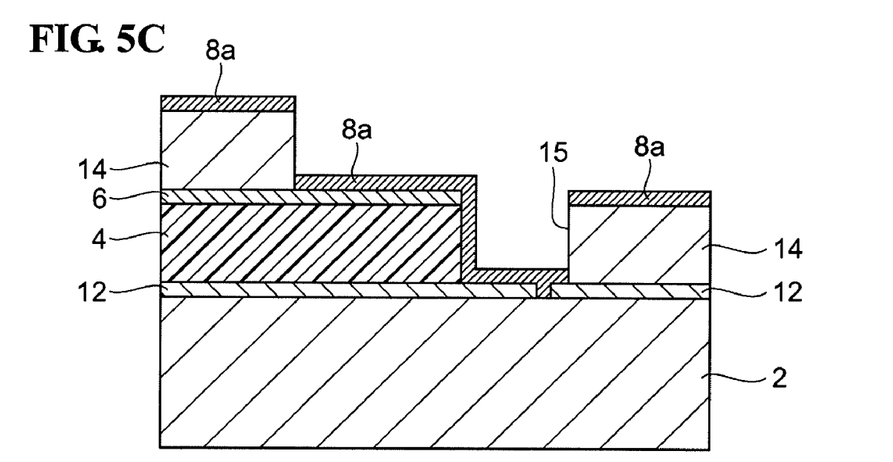

Next, as shown in FIG. 5C, a metal film 8a is deposited over the entire surface of the resist 14 and the semiconductor optical device 2. Next, the resist 14 is removed. Then the electrode pad 8 is formed from the metal film 8a by the liftoff method. After the electrode pad 8 is formed, a mounting wire is bonded to the electrode pad 8. The wire is composed of, for example, gold and is bonded to the electrode pad 8 by ultrasonic waves or heat bonding. The diameter of the wire is, for example, 100 μm.

The semiconductor optical device 10 shown in FIGS. 1 and 2 is manufactured by the above-described steps.

The operation and advantage of the method for manufacturing the semiconductor optical device 10 according to the embodiment of the invention are described. In general, plasma surface processing with gas containing oxygen atoms is not used because it may cause cracking in the BCB resin region. On the other hand, in the embodiment of the invention, the surface 4a of the BCB resin region 4 is processed with the plasma P1 produced from gas containing oxygen atoms in the ICP plasma apparatus, forming the silicon oxide film 6 which has relatively high bonding strength with a metal on the surface 4a of the BCB resin region 4. In this case, cracking in the BCB resin layer can be avoided by controlling the process pressure for producing the plasma P1 and the ICP power and the bias power. Further, the surface 4a of the BCB resin region 4 is processed with the plasma P1 to form projections and recesses on the surface 4a of the BCB resin region 4, thereby increasing the surface area. Therefore, according to the manufacturing method of the embodiment, bonding strength between the electrode pad 8 and the BCB resin region 4 can be increased by the two actions of forming the silicon oxide film 6 and increasing the surface area of the BCB resin region 4.

In addition, a reactive ion etching (RIE) apparatus having a parallel plate electrode is often used for surface-processing a resin. However, when a resin is surface-processed using such as parallel plate-type RIE apparatus, an increase in plasma power (RIE-RF power) for increasing surface roughness of a resin surface increases a self-bias voltage. This has the problem of damaging or removing the silicon oxide film.

For this problem, in the method for manufacturing the semiconductor optical device 10 according to the embodiment, the surface 4a of the BCB resin region 4 is processed with ICP in the plasma processing step as described above. In producing the ICP, each of the bias powder and the ICP power can be independently controlled. In addition, the self-bias voltage has a correlation to only the bias powder. Therefore, the surface of the BCB resin region is processed with the ICP, so that desired surface roughness can be realized by controlling the bias powder to an appropriate range, while the silicon oxide film 6 can be formed to a sufficient thickness by increasing the ICP powder.

Figure 6:
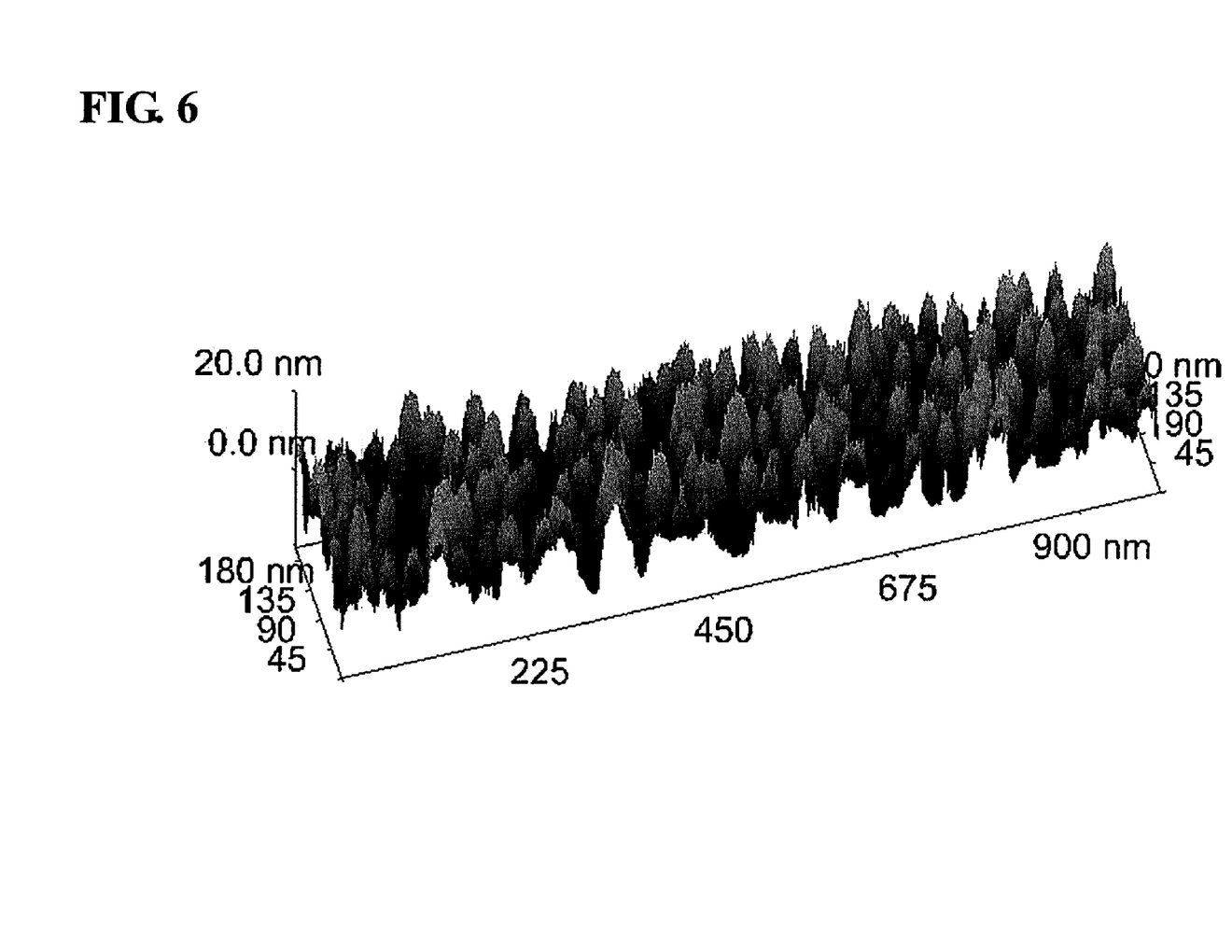
FIG. 6 is an atomic force microscope photograph showing the effect of surface processing.
Figure 7:
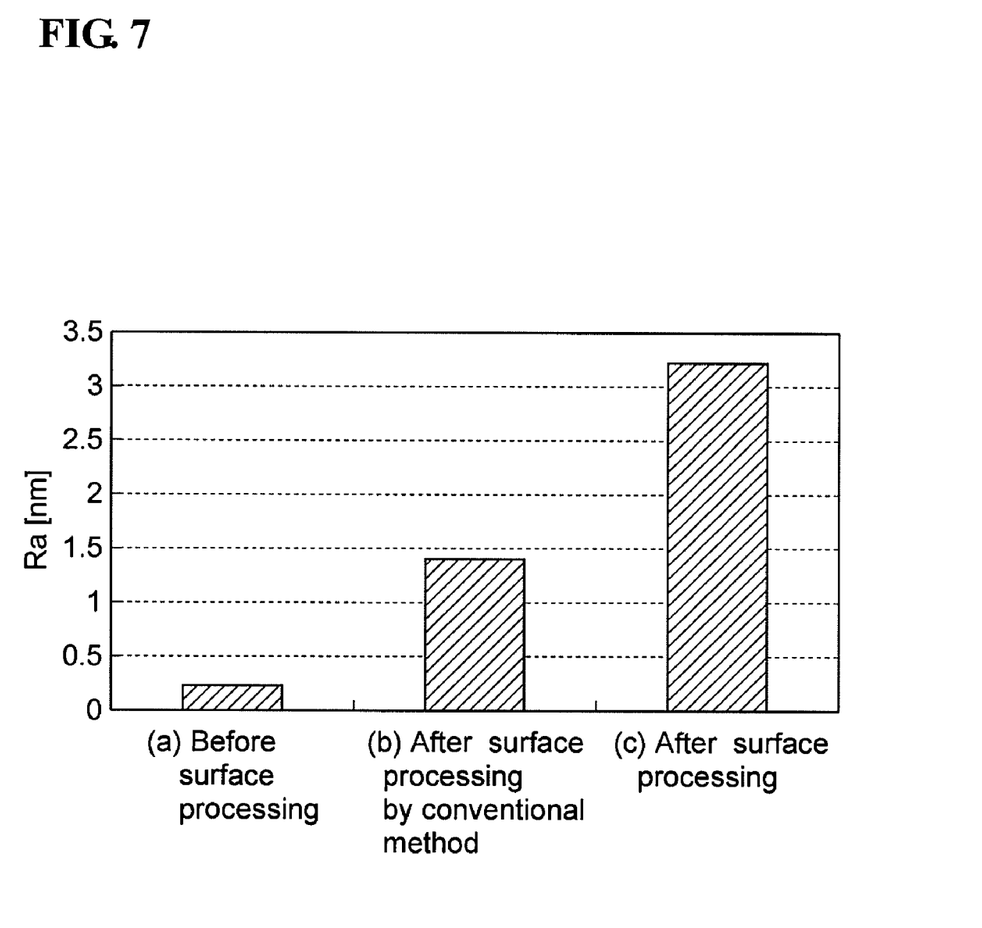
FIG. 7 is a graph showing arithmetic average roughness Ra of a BCB resin region before surface processing, after surface processing using a conventional parallel plate-type RIE apparatus, and after surface processing according to the embodiment of the invention.

FIG. 6 is an atomic force microscope photograph showing the advantage of surface processing according to the embodiment. When the surface of the BCB resin region 4 is processed in the above-described plasma processing step, the scaffold molecules contained in the BCB resin remain after the plasma processing, the other resin portions being removed with the plasma. Therefore, as shown in FIG. 6, an infinite number of conical projections having the scaffold molecules at the tops and a height of 20 nm to 40 nm are formed on the surface 4a of the BCB resin region 4. FIG. 7 is a graph showing arithmetic average roughness (Ra) of the BCB resin region (a) before surface processing, (b) after surface processing using a conventional parallel plate-type RIE apparatus, and (c) after surface processing according to the embodiment of the present invention. FIG. 7 indicates that according to the embodiment, the arithmetic average roughness (Ra) of the BCB resin region can be increased to 3 nm or more from about 1 nm (conventional). Consequently, the surface area of the BCB resin region 4 can be increased, and the area of contact between the electrode pad 8 and the surface 4a of the BCB resin region 4 (and the silicon oxide film 6) can be increased, thereby enhancing the bonding strength between the electrode pad 8 and the BCB resin region 4.

Figure 8:
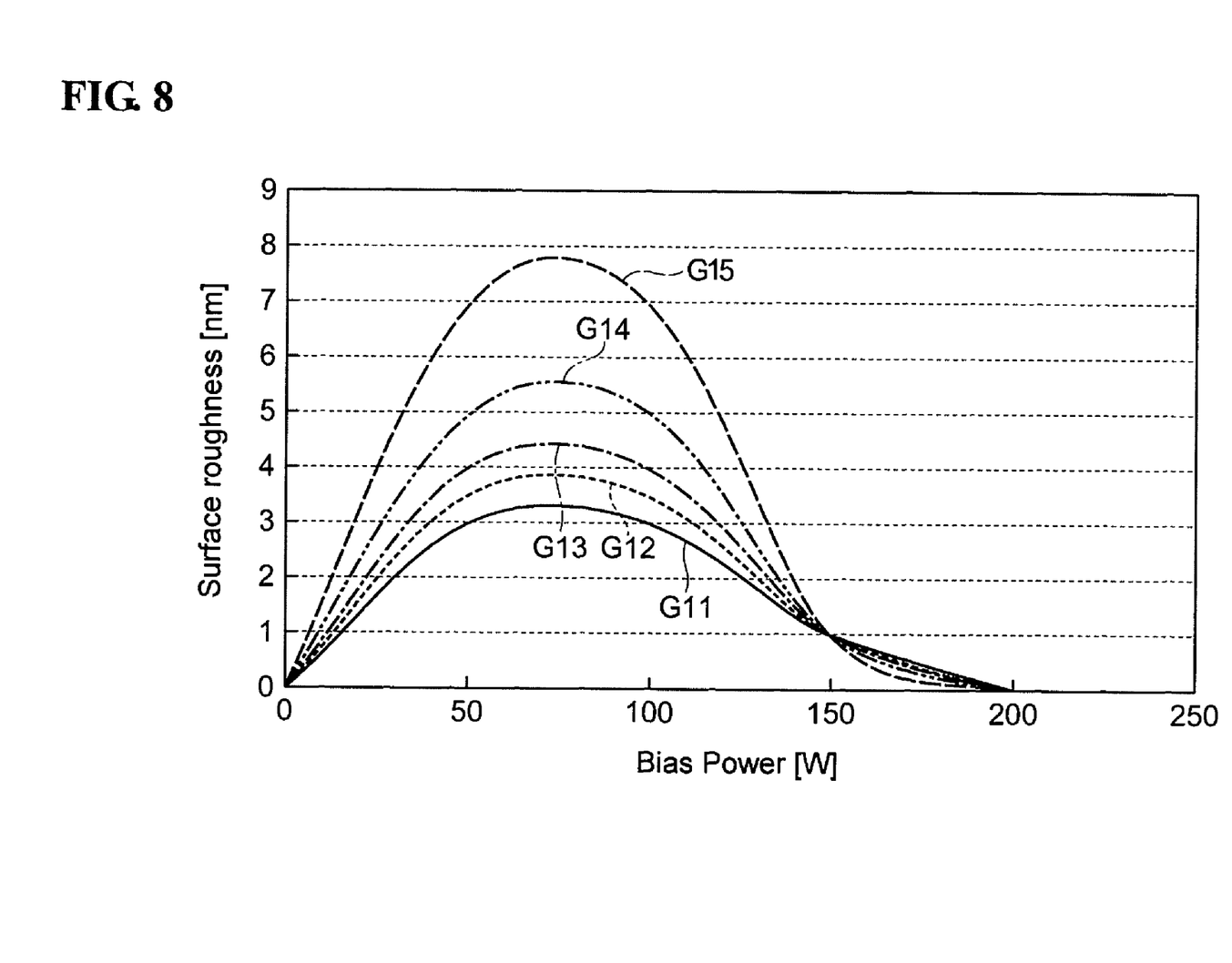
FIG. 8 is a graph showing a relation between bias power and surface roughness Ra of a BCB resin region according to the embodiment.

FIG. 8 is a graph showing a relation between the bias power and the surface roughness Ra of the BCB resin region 4. In FIG. 8, the bias power (unit W) is shown on the abscissa, and the arithmetic average roughness Ra (unit nm) is shown on the ordinate. Graphs G11 to G15 show the cases of ICP power of 0 W, 50 W, 100 W, 150 W, and 200 W, respectively. In order to achieve sufficient bonding strength between the electrode pad 8 and the BCB resin region 4, the arithmetic average roughness Ra is preferably 3 nm or more and 5 nm or less. FIG. 8 indicates that in order to obtain such arithmetic average roughness Ra, the bias powder is preferably 50 W or more and 100 W or less.

Figure 9:
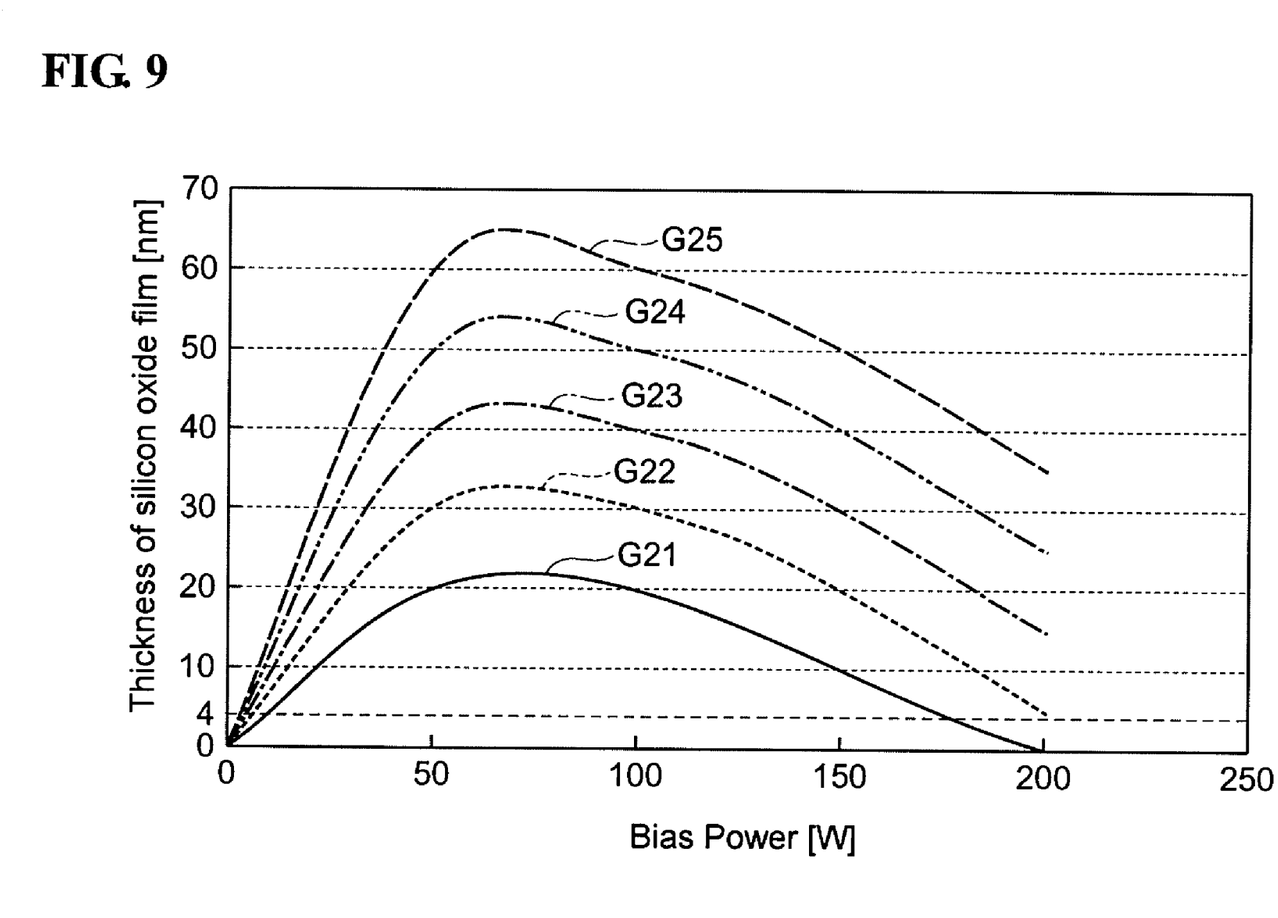
FIG. 9 is a graph showing a relation between bias power and the thickness of a silicon oxide film according to the embodiment.

FIG. 9 is a graph showing a relation between the bias power and the thickness of the silicon oxide film 6. In FIG. 9, the bias power (unit W) is shown on the abscissa, and the thickness (unit nm) of the silicon oxide film 6 is shown on the ordinate. Graphs G21 to G25 show the cases of ICP power of 0 W, 50 W, 100 W, 150 W, and 200 W, respectively. In order to achieve sufficient bonding strength between the electrode pad 8 and the BCB resin region 4, the thickness of the silicon oxide film 6 is preferably 4 nm or more and 50 nm or less. FIG. 9 indicates that in order to obtain such a thickness for the silicon oxide film 6, the ICP powder is preferably 50 W or more and 100 W or less (graphs G22 and G23).

In addition, according to the embodiment of the present invention, the surface roughness of the BCB resin region 4 necessary for improving bonding strength can be achieved by one time of plasma processing, thereby eliminating the need for a plurality of times of plasma processing. Further, according to the embodiment of the present invention, bonding strength between the electrode pad 8 and the BCB resin region 4 can be increased. In order to measure the bonding strength between the electrode pad 8 and the BCB resin region 4, a wire was bonded to the electrode pad 8 and subjected to wire pull testing (WPT). As a result, a wire bond strength of less than 10 g in the case of no surface processing could be improved to 10 g or more.

An example of the method for plasma processing of the surface of the BCB resin region is a method of dry etching with mixed gas containing $CF_4$ and $O_2$. In this method, a $SiO_2$ film containing carbon atoms (C) is formed on the surface of the BCB resin region. Then, the carbon atoms are physically etched off by plasma processing with $N_2$ gas. This method requires the two stages of processing including dry etching with the mixed gas containing $CF_4$ and $O_2$ and the plasma processing with $N_2$ gas. However, in the manufacturing method of the embodiment, the thickness of the silicon oxide film 6 and the surface roughness of the BCB resin region 4 are simultaneously controlled by performing ICP plasma processing with the mixed gas of oxygen-containing gas and inert gas and by adjusting the bias power. Therefore, the thickness of the silicon oxide film 6 can be controlled, and thus the problem of cracking due to the formation of a thick silicon oxide film can be effectively avoided.

In addition, the mixing ratio of the oxygen atom-containing gas to the inert gas may be adjusted for controlling the thickness of the silicon oxide film 6. For example, within the range of $N_2:O_2=9:1$ to $8:2$, the thickness of the silicon oxide film 6 can be adjusted to the range of 4 nm or more and 50 nm or less. When the $N_2$ ratio is increased to $N_2/O_2=9/1$ or more, the thickness of the silicon oxide film 6 is 4 nm or less. While when the $O_2$ ratio is increased to $O_2/N_2=2/8$ or more, the thickness of the silicon oxide film 6 is 50 nm or more.

Further, the surface processing time (ICP plasma irradiation time) of the surface 4a of the BCB resin region 4 is preferably 1 to 2 minutes. When the surface processing time is 1 minute or more, the surface processing can be sufficiently performed, thereby decreasing planar variation in surface roughness of the surface 4a. When the surface processing time exceeds 2 minutes, surface roughness lacks in variety. Therefore, the surface processing can be efficiently performed for a surface processing time of 2 minutes or less.

Second Embodiment

Figure 10:
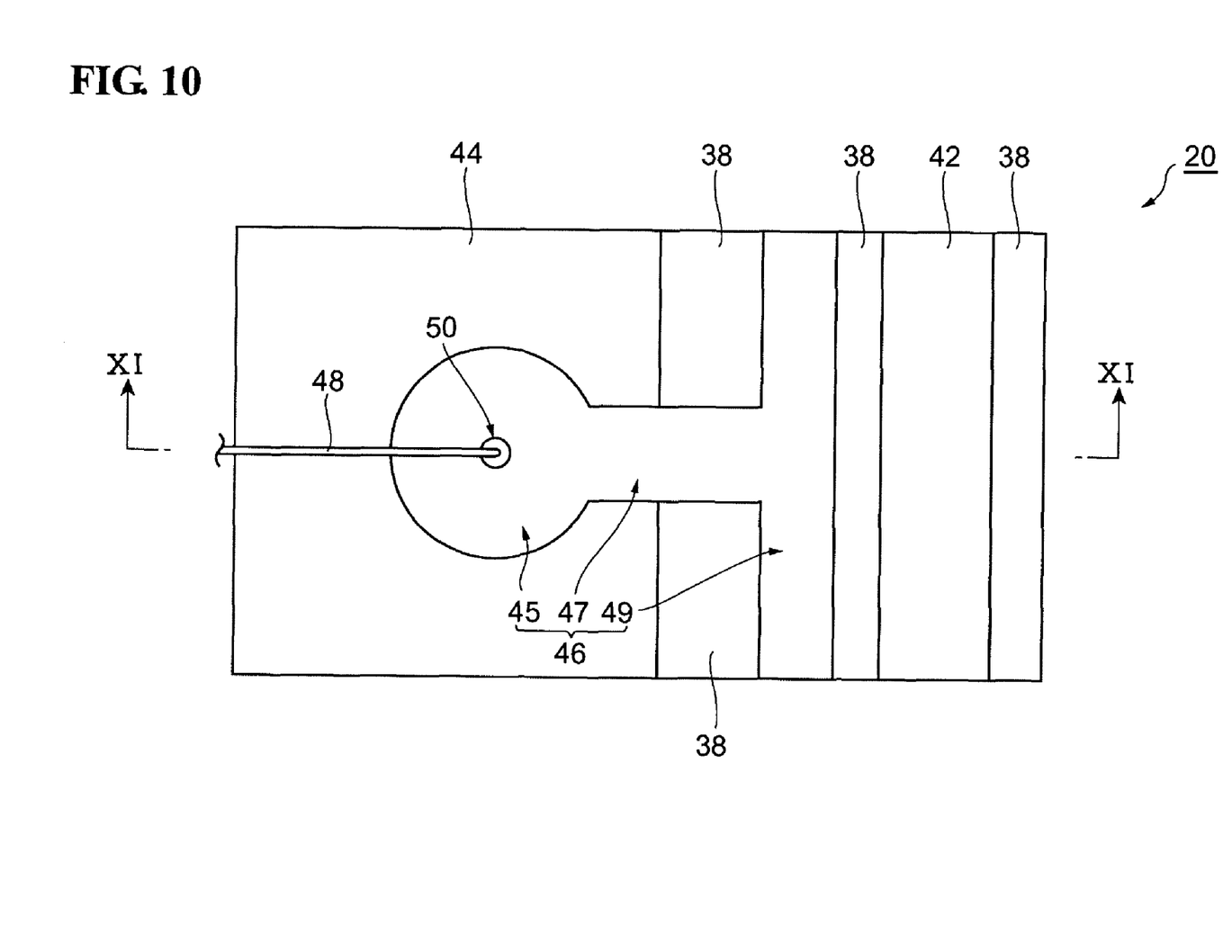
FIG. 10 is a plan view schematically showing a semiconductor optical device according to a second embodiment.
Figure 11:
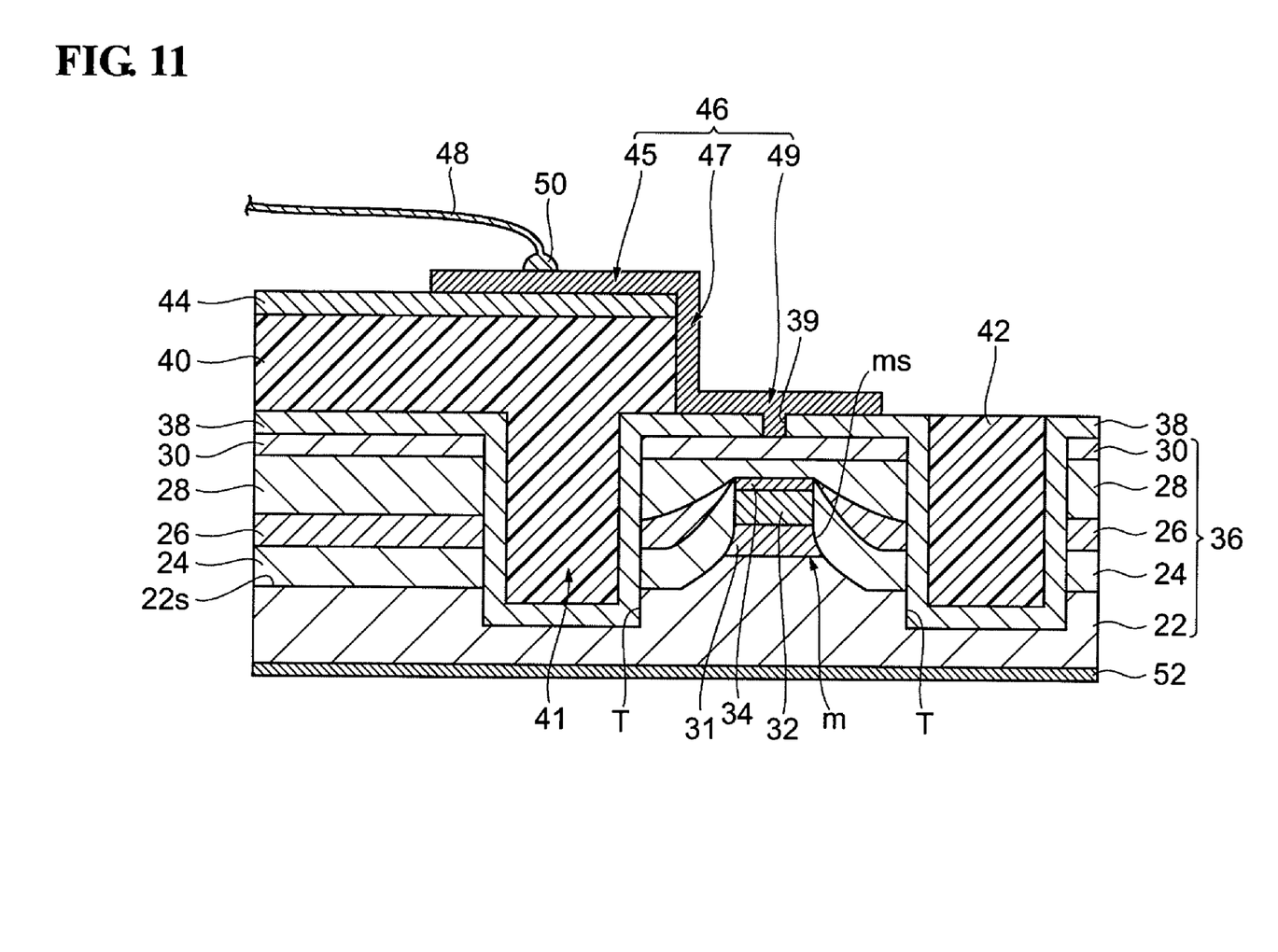
FIG. 11 is a sectional view taken along line XI-XI in FIG. 10.

FIG. 10 is a plan view schematically showing a semiconductor optical device 20 according to a second embodiment. FIG. 11 is a sectional view taken along line XI-XI in FIG. 10. A semiconductor optical device 20 shown in FIGS. 10 and 11 includes a semiconductor laser (semiconductor optical device) 36 mainly composed of a group III-V compound semiconductor, a BCB resin region 40 provided on the semiconductor laser 36, a silicon oxide film 44 provided on the BCB resin region 40, and an electrode pad 46 provided on the silicon oxide film 44. The BCB resin region 40, the silicon oxide film 44, and the electrode pad 46 are provided to adhere to each other. The BCB resin region 40, the silicon oxide film 44, and the electrode pad 46 are composed of the same materials as those of the BCB resin region 4, the silicon oxide film 6, and the electrode pad 8, respectively, in the first embodiment. Also, the silicon oxide film 44 and the electrode pad 46 have the same shapes as those of the silicon oxide film 6 and the electrode pad 8, respectively.

The semiconductor laser 36 is disposed, for example, between the electrode pad 46 and an electrode 52. When a voltage is applied between the electrode pad 46 and the electrode 52, a current is injected in the semiconductor laser 36 to emit a laser beam. The semiconductor laser 36 includes a semiconductor substrate 22 electrically connected to the electrode 52 and a mesa portion m including an active layer 32 and provided on the semiconductor substrate 22. The semiconductor substrate 22 is composed of, for example, InP of a first conductivity type. The first conductivity type is, for example, n type. The active layer 32 preferably has a multi quantum well (MQW) structure. The active layer 32 is composed of a semiconductor material, for example, GaInAsP or AlGaInAs.

The mesa portion m includes a cladding layer 31 of the first conductivity type provided between the semiconductor substrate 22 and the active layer 32, and a cladding layer 34 of a second conductivity type provided on the active layer 32. The second conductivity type is, for example, p type. Buried layers 24 and 26 are provided in that order on the side surfaces ms of the mesa portion m and the main surface 22s of the semiconductor substrate 22. The buried layer 24 is composed of, for example, InP of the second conductivity type, and the buried layer 26 is composed of, for example, InP of the first conductivity type.

A second conductivity type cladding layer 28 is provided on the cladding layer 34 and the buried layer 26. Further, a contact layer 30 is provided on the cladding layer 28 to be electrically connected to the electrode pad 46. The contact layer 30 is composed of, for example, second conductivity type InGaAs.

In addition, trenches T are preferably formed in the semiconductor laser 36 so as to extend from the contact layer 30 to the semiconductor substrate 22. The mesa portion m is disposed between the two trenches T. Further, an insulating layer 38 is preferably provided between the semiconductor laser 36 and the BCB resin region 40 to extend along the trenches T. The insulating layer 38 is composed of a silicon oxide, for example, SiO$_2$. The insulating layer 38 has an opening 39 formed above the mesa portion m, the electrode pad 46 being buried in the opening 39. The electrode pad 46 is in direct contact with the contact layer 30 provided on the mesa portion m at the opening 39. The opening 39 is, for example, a groove extending in a predetermined direction.

The BCB resin region 40 is provided on one of the trenches T and includes a resin portion 41 buried in the one trench T. A resin portion 42 is buried in the other trench T. The resin portion 42 is composed of the same material as the BCB resin region 4.

The electrode pad 46 preferably includes a pad portion 45, an electrode portion 49, and a connection portion 47 which connects the pad portion 45 and the electrode portion 49. The pad portion 45 is disposed on the BCB resin region 40. The electrode portion 49 is buried in the opening 39 and is electrically connected to the contact layer 30. A terminal 50 of a wire 48 is electrically connected to the pad portion 45.

The semiconductor optical device 20 according to the embodiment is manufactured by the same method as that for the semiconductor optical device 10 of the first embodiment. That is, the semiconductor optical device 20 is manufactured through a resin layer forming step of forming the BCB resin region 40 on the semiconductor laser 36, a plasma processing step of processing the surface of the BCB resin region 40 with ICP produced from oxygen-containing gas to form projections and recesses on the surface of the BCB resin region 40 and form the silicon oxide film 44 on the surface of the BCB resin region 40, and an electrode pad forming step of forming the electrode pad 46 made of a metal on the surface of the BCB resin region 40. Therefore, like in the first embodiment, bonding strength between the electrode pad 46 and the BCB resin region 40 can be increased.

Although the preferred embodiments of the present invention are described in detail above, the present invention is not limited to these embodiments. For example, in order to thin the BCB resin region, dry etching may be performed with CF$_4$ gas or mixed gas of CF$_4$ and O$_2$ between the resin layer forming step and the plasma processing step.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for manufacturing a semiconductor optical device, the method comprising the steps of:
    forming a BCB resin region on a semiconductor optical device;
    producing an inductively coupled plasma from a gas containing oxygen atoms and nitrogen atoms and processing a surface of the BCB resin region with the produced plasma in an inductively coupled plasma apparatus that is provided with a susceptor, a high-frequency power supply for supplying ICP power and a high-frequency power supply for supplying bias power to the susceptor to form a silicon oxide film on the surface of the BCB resin region the step of processing of the surface of the BCB resin region including:
        controlling the supply of the ICP power to control the thickness of the silicon oxide film formed by said processing, and
        controlling the supply of the bias power independently of the control of the supply of ICP power to cause formation of projections and recesses roughening the BCB resin region surface by the nitrogen atoms in the produced plasma; and forming an electrode pad composed of a metal on the surface of the BCB resin region in direct contact with the silicon oxide film.

2. The method for manufacturing a semiconductor optical device according to claim 1, wherein in the step of processing the surface of the BCB resin region, the bias power is 50 W or more and 100 W or less.

3. The method for manufacturing a semiconductor optical device according to claim 2, wherein in the step of processing the surface of the BCB resin region, the ICP power is 50 W or more and 100 W or less.

4. The method for manufacturing a semiconductor optical device according to claim 1, wherein in the step of processing the surface of the BCB resin region, the surface roughness of the BCB resin region is 3 nm or more and 5 nm or less.

5. The method for manufacturing a semiconductor optical device according to claim 1, wherein in the step of processing the surface of the BCB resin region, the thickness of the silicon oxide film is 4 nm or more and 50 nm or less.

6. The method for manufacturing a semiconductor optical device according to claim 1, wherein the electrode pad is composed of a metal containing titanium.

7. The method for manufacturing a semiconductor optical device according to claim 1, wherein the electrode pad has a three-layer structure of titanium/platinum/gold and is formed so that titanium is in direct contact with the silicon oxide film formed on the surface of the BCB resin region.

8. The method for manufacturing a semiconductor optical device according to claim 1, further comprising the step of forming an insulating layer on the semiconductor optical device.

9. The method for manufacturing a semiconductor optical device according to claim 8, further comprising the step of forming an opening in the insulating layer,
wherein the electrode pad is formed on the silicon oxide film formed on the surface of the BCB resin region, on the insulating layer, and in the opening to electrically connect the electrode pad to the semiconductor optical device.

* * * * *